US012692151B2

(12) United States Patent
Torkkeli et al.

(10) Patent No.:  US 12,692,151 B2
(45) Date of Patent:      Jul. 28, 2026

(54) MICROELECTROMECHANICAL ELEMENT AND A METHOD FOR MANUFACTURING IT

(71) Applicant: Murata Manufacturing Co., Ltd., Nagaokakyo (JP)

(72) Inventors: Altti Torkkeli, Tuusula (FI); Jussi Oksanen, Nummela (FI); Aarni Härkönen, Helsinki (FI); Juha Lahdenperä, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 445 days.

(21) Appl. No.: 18/333,924

(22) Filed: Jun. 13, 2023

(65) Prior Publication Data

US 2023/0406698 A1      Dec. 21, 2023

(30) Foreign Application Priority Data

Jun. 13, 2022    (FI) ..................................... 20225524

(51) Int. Cl.
B81C 3/00          (2006.01)
B81B 7/02          (2006.01)

(52) U.S. Cl.
CPC ................ B81C 3/001 (2013.01); B81B 7/02 (2013.01); B81B 2201/0264 (2013.01); B81B 2203/0315 (2013.01); B81B 2203/0361 (2013.01); B81B 2203/04 (2013.01); B81B 2207/094 (2013.01); B81C 2201/013 (2013.01); B81C 2201/0147 (2013.01); B81C 2201/0156 (2013.01); B81C 2203/031 (2013.01)

(58) Field of Classification Search
CPC ............... B81C 1/00301; B81C 3/001; B81C 2203/0118; B81C 1/00269; B81B 2207/096; B81B 7/02; B81B 2201/0264; B81B 2203/0315; B81B 2203/0361; B81B 2203/04; B81B 2207/094
See application file for complete search history.

(56) References Cited

U.S. PATENT DOCUMENTS

| | | | | |
|---|---|---|---|---|
| 7,049,165 B2 * | 5/2006 | Oguchi | ............... | B81C 1/00587 |
| | | | | 148/DIG. 135 |
| 2006/0063462 A1 * | 3/2006 | Ding | ..................... | B81B 7/0038 |
| | | | | 445/24 |
| 2007/0099395 A1 * | 5/2007 | Sridhar | ............... | B81C 1/00301 |
| | | | | 438/460 |
| 2007/0172976 A1 * | 7/2007 | Partridge | ................ | B81B 7/007 |
| | | | | 438/53 |
| 2015/0069618 A1 * | 3/2015 | Gudeman | ............... | B81B 7/007 |
| | | | | 257/774 |
| 2015/0279756 A1 * | 10/2015 | Erlesand | ............. | H10W 70/635 |
| | | | | 174/257 |
| 2016/0130135 A1 | 5/2016 | Kamisuki | | |
| 2018/0290882 A1 * | 10/2018 | Rhee | ....................... | B81B 7/007 |

(Continued)

*Primary Examiner* — Moazzam Hossain

(74) *Attorney, Agent, or Firm* — ArentFox Schiff LLP

(57) ABSTRACT

A microelectromechanical element is provided with patterned regions of wafer material and glass material. The regions of glass material include at least a first glass region and a second glass region formed of a first glass material and a second glass material, respectively. The first glass material enables anodic bonding with the wafer material. An alkali metal content of the second glass material is less than an alkali metal content of the first glass material.

9 Claims, 9 Drawing Sheets

(56) References Cited

U.S. PATENT DOCUMENTS

| 2019/0135619 | A1 | 5/2019 | Quenzer et al. |
| 2020/0158751 | A1* | 5/2020 | Malvern ................. G01P 15/13 |
| 2020/0283292 | A1 | 9/2020 | Torkkeli et al. |

* cited by examiner

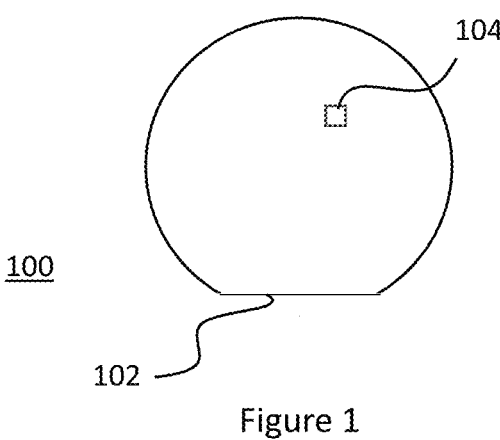
Figure 1
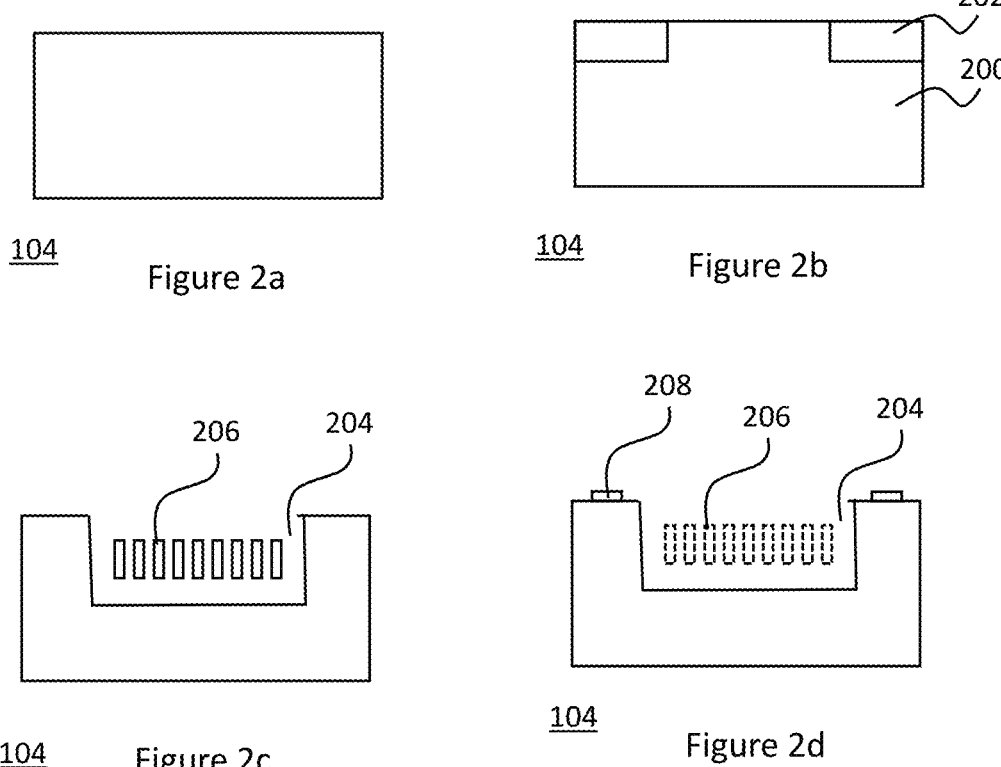
104     Figure 2a
104     Figure 2b
104     Figure 2c
104     Figure 2d

350

304

380

380

300

360

354

358

350

354

300

MICROELECTROMECHANICAL ELEMENT AND A METHOD FOR MANUFACTURING IT

CROSS REFERENCE TO RELATED APPLICATIONS

This application claims priority to Finnish Patent Application No. 20225524, filed Jun. 13, 2022, the contents of which are hereby incorporated by reference in its entirety.

TECHNICAL FIELD

This disclosure text relates to microelectromechanical elements and, more particularly, to microelectromechanical elements formed of at least two wafers bonded to each other.

BACKGROUND

Anodic bonding is an electrochemical process that can be used to create high-quality hermetic seals between glass and silicon without an intermediate layer. Hermetic sealing between silicon and borosilicate glass is an encapsulation method, which is widely used in microelectromechanical systems (MEMS) structures to provide a controlled atmosphere for micrometre-scale parts moving in them. Anodic bonding is also considered well applicable to achieve accurate structural functions, like retaining required control of distances between capacitive sensor electrodes. The anodic bonding process is known as "field assisted sealing" or "electrostatic bonding" because silicon is bonded to glass at elevated temperature, using the assistance of a high electrostatic field.

The anodic bonding between silicon and alkali containing borosilicate glass surfaces is achieved by putting the surfaces in contact, heating them and applying a high DC voltage, such that the glass is negative with respect to the silicon. As a result of the increased temperature, the mobility of alkali cations ($Na^+$, $K^+$, $Li^+$ ions) in the glass increases, the ions start to diffuse towards the cathode and form an alkali-depletion zone to the bond interface. A large electrostatic field persists in the depletion layer and maintains the surfaces under high electrostatic pressure. Chemical reactions between the oxygen ions and silicon take then place at the bond interface, which results in formation of a thin oxide layer that permanently connects the surfaces to each other.

Anodic bonding is considered to provide almost perfect hermetic seals. However, when used in encapsulation, reaction products of alkali ions in the sealed gap may cause problems, like instability to the built-in bias voltage of the capacitive electrodes. On the other hand, alkali ions diffused to the cathode may combine with ambient humidity and form highly erosive hydroxides.

SUMMARY OF THE INVENTION

Examples provided in this disclosure describe ways to implement and manufacture an improved microelectromechanical element of wafers bonded to each other. The improvement is achieved by features of a microelectromechanical element and a manufacturing method that are characterized by what is stated in the independent claims.

Thus, in an exemplary aspect, a microelectromechanical element is provided that includes a plurality of microstructures of wafers bonded to each other, such that a gap is closed by bonding of the microstructures; mobile structure parts suspended to move within the closed gap; at least one internal electrode arranged in the gap and configured to detect or actuate movement of the mobile structure parts; and patterned regions of wafer material and glass material, the regions of glass material including at least a first glass region comprising a first glass material and a second glass region comprising a second glass material. In this aspect, the first glass material enables anodic bonding with the wafer material, and the second glass material has an alkali metal content that is less than an alkali metal content of the first glass material.

In another exemplary aspect, a method for manufacturing a microelectromechanical element of wafers bonded to each other is provided. In this aspect, the method includes forming a plurality of microstructures, which include first and second microstructures, by patterning into a first wafer for each of the first microstructures a recess and mobile structure parts that are suspended to move within the recess; forming into at least one of the first and second microstructures at least one internal electrode arranged to detect or actuate movement of the mobile structure parts; forming into at least one of the first and the second microstructures a first glass region of a first glass material configured to be anodically bonded to a wafer material of the first wafer or a second wafer; forming into at least one of the first and the second microstructure a second glass region of a second glass material, wherein the second glass material has an alkali metal content that is less than the alkali metal content of the first glass material; permanently fixing the first wafer and the second wafer by anodically bonding the first glass regions to the wafer material of the first wafer or of the second wafer; and dicing the microelectromechanical element from the anodically bonded first and second wafers.

The examples disclose the idea of using two different types of glass material, wherein one of them is suitable for anodic bonding and the other one has a composition with reduced alkali metal content so that the possible adverse effects outlined above are avoided or at least alleviated.

BRIEF DESCRIPTION OF THE DRAWINGS

In the following examples of the invention will be described in greater detail by means of drawings, in which FIG. 1 illustrates an exemplary wafer;

FIGS. 2a to 2d illustrate exemplary microstructures of the exemplary wafer of FIG. 1;

DETAILED DESCRIPTION

Figure 3:
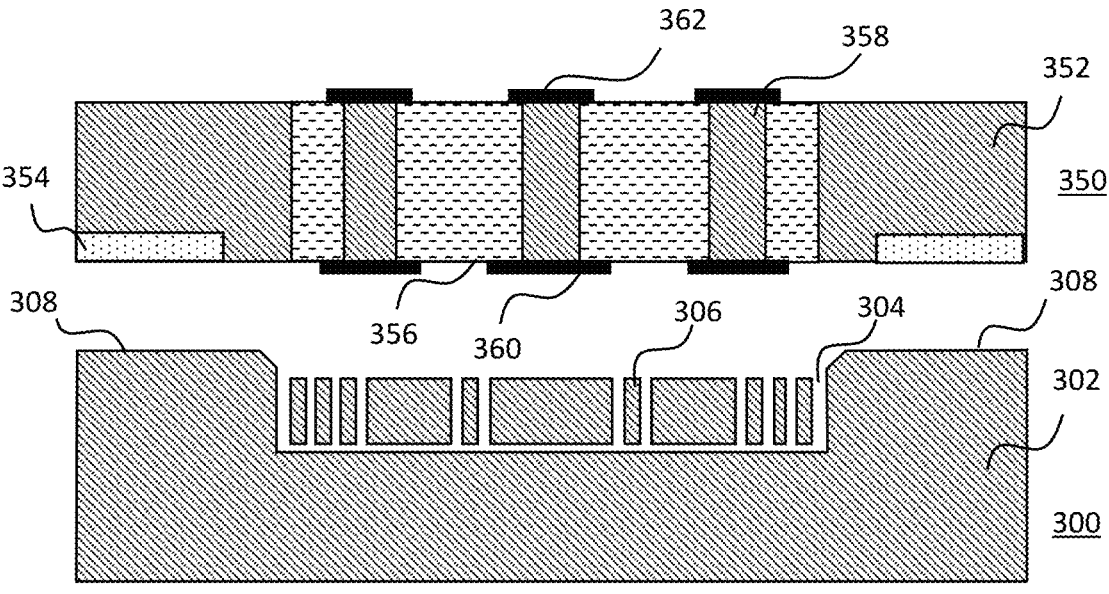
FIG. 3 illustrates the basic concept of wafer regions.

The following examples describe a method for manufacturing a microelectromechanical element in a wafer bonding process. For purposes of this disclosure, the term "microelectromechanical element" refers to a functional structure that is manufactured in a manner similar to integrated circuits and has components for mechanical and electrical functions. Dimensions of the components are typically expressed in micrometers, and the overall size of a micro-electromechanical element is typically of the order of millimeters, but the term "micro" does not relate here to any specific metric dimension. Instead, the term "micro" in this context is, in its generic form, a prefix that describes something which is smaller relative to its macro counterpart.

Like integrated circuits, microelectromechanical elements are manufactured in wafer bonding processes. When anodic bonding is used in wafer bonding processes, a permanent contact is formed between surface parts of at least two wafers. A wafer refers here to a slice of solid material(s) that can be used for the fabrication of microelectromechanical system (MEMS) elements. A wafer may be formed of uniform material or it may include layers of different materials. A wafer is basically a planar object, but it may undergo microfabrication processes that shape it so that a surface of the resulting wafer is not uniformly planar but includes carefully controlled and dimensioned recesses and/or regions of various materials and shapes. In this description, directions that are parallel to the originally planar form of the wafer are in-plane directions and a direction that is perpendicular to the in-plane directions is the out-of-plane direction. A wafer may include, for example, a uniform slice of glass, crystalline silicon wafer, or a structural wafer like a crystalline silicon wafer with insulator and polysilicon layers on it, a silicon-on-insulator (SOI) wafer, a cavity SOI wafer (C-SOI) or a device wafer layer of C-SOI wafer.

A wafer includes bonding surface parts that are designed to get into permanent contact with bonding surface parts of another wafer in the wafer bonding process. Advantageously, the bonding surface parts may be locally planar and align to a contact plane that is common to all bonding surface parts of the wafer. However, both wafers to be bonded do not necessarily need to be micro-processed before bonding. One wafer may provide a planar surface that is bonded to a recessed surface of another wafer.

These basic concepts are illustrated with examples in FIG. 1 and FIGS. 2a to 2c. In particular, FIG. 1 illustrates an exemplary wafer 100 formed of a crystalline silicon material. Wafers typically have one or more flats 102 or notches cut into one or more sides of the wafer to indicate crystallographic planes of the wafer. Several microstructures 104 may have been formed onto the wafer by microfabrication, or microstructures may be included in the wafer and be cut off the wafer when the wafer is diced in the end of the element manufacturing process. The microfabrication process may include one or more subprocesses, like doping, ion plantation, etching, thin-film deposition, and/or photolithographic patterning, for example. Through the wafer bonding process, each of these microstructures 104 gets into a permanent contact with a corresponding microstructure in another wafer and the microstructures thereby form a MEMS element. The individual MEMS elements can be separated into dies by wafer dicing and then further forwarded for device packaging.

Microstructures 104 in at least one of the wafers to be bonded often include recesses. These are needed, for example, in a final MEMS element to provide an open space in which the mechanically moving parts of the system can move. To enable controlled mechanical operation of the system, such open spaces preferably become hermetically closed when opposing microstructures are permanently attached to each other in the wafer bonding process.

FIGS. 2a to 2d illustrate some examples of microstructures of FIG. 1. As explained above, the wafer 100 of FIG. 1 includes a plurality of microstructures, some exemplary forms of which are shown with FIGS. 2a to 2d. In order to minimize the cost per die, the number of dies that can be made from a single wafer is typically maximized.

FIG. 2a illustrates a simple form of a microstructure 104 that has a non-patterned, planar surface. Such a microstructure in one wafer may be bonded to a microstructure in another wafer, and the latter may comprise one or more recesses and bonding surface parts. In the wafer bonding process, bonding surface parts in opposing microstructures become permanently fixed to each other such that the recesses form hermetically closed cavities. The microstructure of 2a may be, for example, a glass layer element that is to be bonded to a microstructure that includes mirror and spring elements of an optical device. The microstructure of 2a may also be, for example, a semiconductor plate designed to extend over a gap formed for a pressure sensor microstructure in the opposing wafer. These are examples only, other types of microstructures with the same form are included in the scope.

FIG. 2b illustrates another type of a microstructure that still includes a planar surface but has been microfabricated to include regions of different materials. These regions may exist in the microstructure, for example, to form bonding surface parts that through their material characteristics enable or even induce a chemical, electrical, adhesive or other mechanism necessary to implement the wafer bonding process and form a desired permanent contact between bonding surface parts in opposing microstructures. According to an exemplary aspect, the microstructure 104 of FIG. 2b may include, for example, a silicon substrate 200 onto which regions of glass have been microfabricated to form bonding surface parts 202. By such bonding surface parts the microstructure can be sealed to silicon or metal surfaces in an opposing microstructure in an anodic bonding process. However, this is an example only, other type of materials and microfabricated forms with similar surface forms may be applied in the scope.

FIG. 2c illustrates a microfabricated microstructure 104 that includes a recess 204 and mobile structure parts 206 that extend into the recess. The mobile structure parts 206 are thus surrounded by a void space in which they can move in order to implement the designed function of the MEMS element the microstructure is part of. The microstructure of FIG. 2c may be, for example, a part of a microelectromechanical accelerometer device and the mobile structure parts 206 may include comb structures for capacitive detection. However, this is an example only, other type of materials and microfabricated forms similar surface forms may be applied in the scope.

FIG. 2d illustrates an additional example where bonding surface parts 202 of the microstructure 104 are not planar but include some inwards and/or outwards extending formations that are intended to bond with matching formations in bonding surface parts of the opposite microstructure. FIG. 2d shows an example where the formation is a protuberance 208.

As mentioned above, the anodic bonding process refers here to a specific process where a permanent contact is formed between the bonding surface parts of at least two wafers. This permanent contact encapsulates microstructures in bonded wafers into MEMS elements where sensitive internal structures are protected from environmental influences such as temperature, moisture, high pressure and oxidizing species, for example.

Returning back to FIG. 1, embodiments of the present disclosure disclose an exemplary arrangement where microelectromechanical element formed by bonding the 104 microstructure to at least one other microstructure in another wafer is arranged to include two different types of glass regions. The glass material of one of the glass regions is selected so that the anodic bonding can be securely made, but the glass material in the other one of the glass regions is different and has a much lower alkali metal content. By concentrating the alkali metal content to glass regions that participate to the anodic bonding, the release of alkali and formation of hydroxide can be significantly reduced.

FIG. 3 illustrates the basic concept of these regions by showing two microstructures 300, 350 that are to be anodically bonded to each other and to thus form a microelectromechanical element. Before anodic bonding, a first microstructure 300 is included in a first wafer as shown in FIG. 1, and a second microstructure 350 is included in a second wafer.

In this example, the different regions of glass material are in the same microstructure, here the second microstructure 350. The first microstructure 300 includes a body 302 that is patterned to include at least one recess 304 and mobile structure parts 306 that are suspended to move within the recess. For purposes of this disclosure, the term "suspend" or "suspended" means that at least one portion of a suspended mobile structure part is firmly attached to the body 302 but the mobile structure part includes one or more flexible portions that enable at least part of the mobile structure part to move with respect to the body 302. The example of FIG. 3 shows comb structures wherein comb fingers form bending beams for capacitive detection. Other forms of structures and types of enabled elastic motion (e.g., torsional, transversal, and the like) are well known to a person skilled in the art and may be applied within the scope. The body and the mobile structure parts may be of material of the wafer, typically crystalline silicon, but either of them may also include regions to which some other material has been deposited. In this example, a region 308 surrounding the recess in the first microstructure is formed of the wafer material that can be anodically bonded to glass.

In this example, the second microstructure 350 is a is a cap microstructure that includes regions of wafer material 352 and regions of glass material 354, 356. In the exemplary aspect, the regions of glass material are configured to serve different functional purposes in the second microstructure and are in this structure set to be formed of different glass materials. A first glass region 354 serves the purpose of anodic bonding and is therefore positioned to get into contact with the region 308 that surrounds the recess 304 in the first microstructure when the first wafer and the second wafer are put into contact for bonding. The first glass region 354 is formed of a first glass material that can be anodically bonded to silicon. In other words, the first glass material enables anodic bonding with the wafer material in bonding temperatures below its glass transition temperature. With frequently used glass materials, anodic bonding is enabled when alkali metal content in form of oxides in glass material is 1 wt % or more. Another way to evaluate enablement is through ionic conductivity, typically for enabling anodic bonding ionic conductivity of the first glass material should be more than $10^{-9}$ Ohm$^{-1}$ cm$^{-1}$ at temperatures between 300° C. to 600° C. Examples of first glass materials that are suitable for anodic bonding include Corning 7740 (also known by the trademark "Pyrex"), Corning 7070 and Schott Borofloat, to mention some. The suitability of these example first glass materials for anodic bonding is based on their alkali metal content and the close match between their temperature coefficients of expansion to that of silicon. For example, the given coefficient of linear thermal expansion of an exemplary Schott Borofloat®33 is 3.25×$10^{-6}$ K$^{-1}$ and alkali metal content in form of oxides is in the order of 4%. Other glass materials that provide similar alkali metal contents and temperature coefficients of expansion may be applied within the scope.

A second glass region 356 serves another functional purpose and is formed of a second glass material. The second glass region is arranged into position or positions that do not need to undergo the anodic bonding process and therefore the alkali metal content of the second glass material can now be set to be different from the alkali metal content of the first glass material. Specifically, the second glass material is selected so that its alkali metal content in form of oxides is less than 0.5 wt %. Formulated alternatively, ionic conductivity of the second glass material is advantageously less than $10^{-9}$ Ohm$^{-1}$ cm$^{-1}$ at temperatures between 300° C. to 600° C. However, like glass for anodic bonding, the temperature coefficient of expansion of the second glass material needs to closely match with that of silicon. The reduced alkali content of the second glass material means that the release of alkali and formation of erosive substances during the manufacturing process and later on is reduced. Examples of second glass materials that have appropriately matching temperature coefficients of expansion and alkali contents within the set range include Schott AF®32 alkali-free alumina-borosilicate glass, Corning® Eagle XG®, Corning® Eagle 2000®, to name some. For example, the given coefficient of linear thermal expansion of an exemplary Schott AF®32 alkali-free alumina-borosilicate glass is 3.2×$10^{-6}$ K$^{-1}$ and alkali metal content in form of oxides is less than 0.2 wt %. Other glass materials that provide similar alkali metal contents (alkali metal content in form of oxides preferably less than 0.5 wt %) and temperature coefficients of expansion may be applied within the scope.

Glasses with different material parameters typically respond differently to changes in temperature. The glass-liquid transition, or glass transition, is the gradual and reversible transition in amorphous materials from a hard and relatively brittle "glassy" state into a viscous or rubbery state as the temperature is increased. In order to ensure provision of separate glass regions in one wafer, the first and second glass materials are selected so that the glass transition temperature of the first and second glass regions are different and differ according to an applied manufacturing process. The glass region that is formed first in the process is set to have a higher glass transition temperature than the glass region which is formed later. In the example of FIG. 3, the second glass regions are formed before the first glass regions so the glass transition temperature of the second glass material is higher than the glass transition temperature of the first glass regions. For example, the glass transition temperature given for the exemplary Schott Borofloat®33 for the first glass region is 525 degrees, whereas the glass transition temperature given for the exemplary Schott AF®32 alkali-free alumina-borosilicate glass for the second glass region is 717 degrees. When the second glass regions are formed and cooled down first, heating of the structures to temperatures that enable forming of the first glass regions does not essentially cause deformations to the second glass regions.

In the example of FIG. 3, the second microstructure 350 is a cap microstructure that includes a plurality of through vias 358, electrically isolated from each other by regions of second glass material 356. A through via 358 is a continuous formation of the wafer material of the second wafer, which extends in the out-of-plane direction from one side of the second microstructure to another side of the microstructure, i.e. through the second microstructure. The through via 358 is surrounded by a second glass region 356 that electrically insulates the through via from other parts of the second microstructure. The through via thus provides an electrical connection path from one side of the second microstructure to another side of the second microstructure. Each through via 358 terminates to an internal electrode 360 that in this example is on a first side of the second microstructure, i.e. the side that is put against the first microstructure when the first wafer and the second wafer are bonded to each other. On the second side the through via 358 terminates to an external electrode 362 that provides an external point of electrical contact for the microelectromechanical element. According to exemplary aspects, the material of the internal and external electrodes 360, 362 may include, for example, metals, or doped semiconductor materials. The method for manufacturing the second microstructure is discussed in more detail below.

Figure 4:
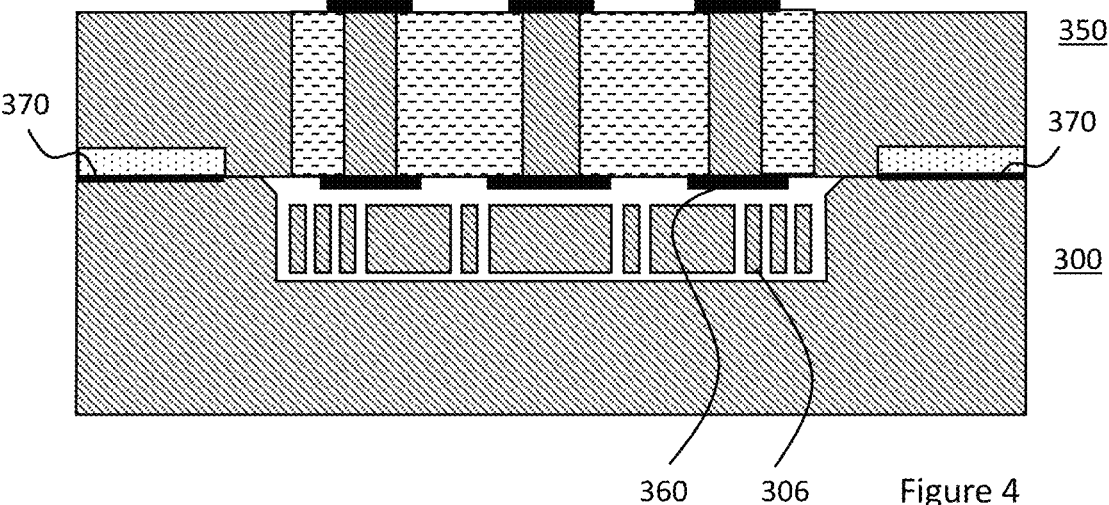
FIG. 4 illustrates the two microstructures after wafers have been bonded to each other according to an exemplary aspect.

FIG. 4 illustrates the two microstructures 300, 350 of FIG. 3 after the wafers have been bonded to each other according to an exemplary aspect. The other parts of the microstructures have been described with FIG. 3, but the thick lines 370 in FIG. 4 illustrate the oxide layer that is formed by the anodic bonding and irreversibly connects the surface of a first glass region 354 in the first microstructure 350 to the semiconductor wafer material surface of the first microstructure. The thickness of the line 370 is naturally exaggerated, in actual implementations, the oxide formation is a very thin layer, of the order of tens of nanometers or even less. When the anodic bonding has been completed, the recess or recesses in the first microstructure close to form a hermetically closed gap that incorporates the mobile structure parts and enables their motion in it.

At the same, the internal electrodes 360 become fixed into a specific position that is in the vicinity of the mobile structure parts 306 but separated from them with a non-zero distance. The mobile structure parts may be designed for detection and thus to move according to a physical phenomenon to be detected. In this example, the distance between the internal electrodes and the mobile structure parts then varies by motion of the mobile structure parts, and the change in in capacitance, and thus the physical phenomenon causing it may be measured with circuit means well known to a person skilled in the art, for example by a bridge circuit. Alternatively, the mobile structure parts may be designed to be actuated to motion with a circuit that applies a controlled voltage between them and the internal electrodes. In this example, the distance between the internal electrodes and the mobile structure parts and the distance between the internal electrodes and the external electrodes extend vertically. Depending on the design and purpose of the bonded microstructures, one or both of these distances may extend horizontally. The term internal electrode refers here generally to any electrode structure that becomes enclosed into the gap through the anodic bonding process. The term external electrode refers here generally to any electrode structure that remains accessible after the gap is closed in the anodic bonding process.

Figure 5:
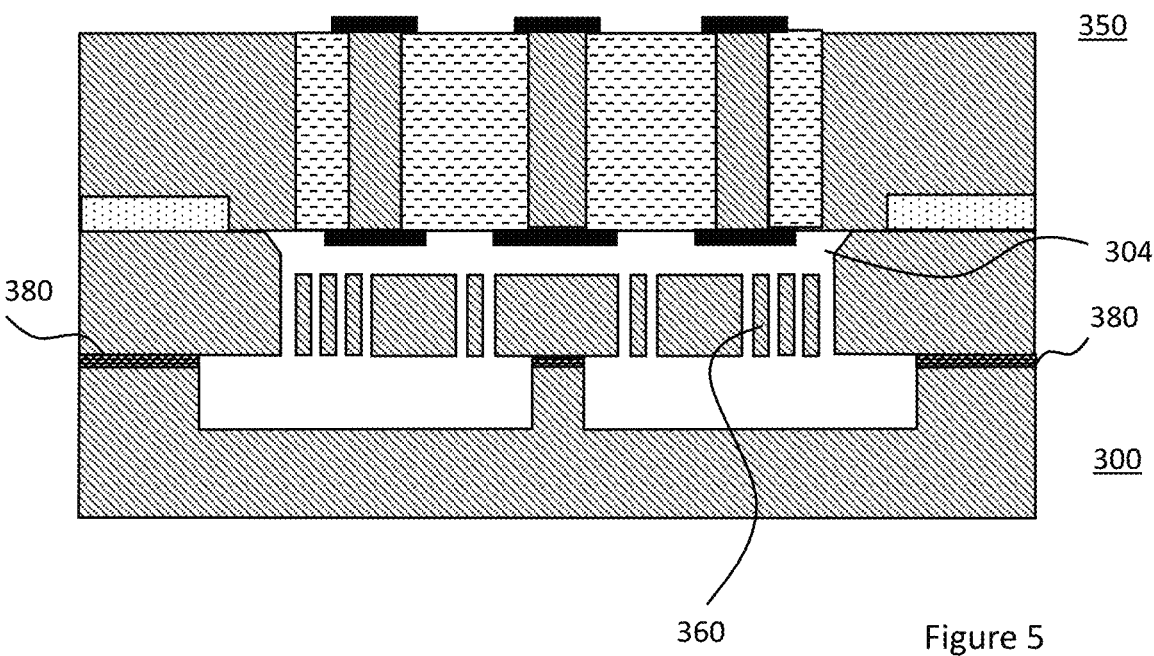
FIG. 5 illustrates two bonded microstructures according to an exemplary aspect.

FIG. 5 illustrates an example similar to the one in FIG. 3, but the first microstructure 300 includes an insulator layer between two layers of wafer material. The mobile structure parts 360 and the gap 304 are in one of the two layers of wafer material in the first microstructure and the other one of the two layers of wafer material includes one or more cavities that connect with the gap. Examples of wafers for the first microstructure include silicon-on-insulator (SOI) structures that include a single-crystal silicon layer and a bulk substrate, separated by an insulating layer (for instance $SiO_2$). In the case of SOI wafers, the mobile structure parts 360 and the gap 304 are in said single-crystal silicon layer, which provides a defect-free material with well-controlled doping levels for conductivity. With SOI structures, the mobile structure parts and the gap can be patterned by etching the top silicon layer, and then released by sacrificial etching of the oxide layer with, for example, hydrofluoric acid (HF) solutions. The bulk substrate of SOI wafers can further include pre-etched cavities (cavity-SOI, C-SOI). These cavities have well-defined dimensions because they can be lithographically patterned prior to bonding to the single-crystal silicon layer. Furthermore, the parasitic capacitance between the mobile structure parts and the bulk substrate can be decreased with deep cavities and small bonding areas.

Figure 6:
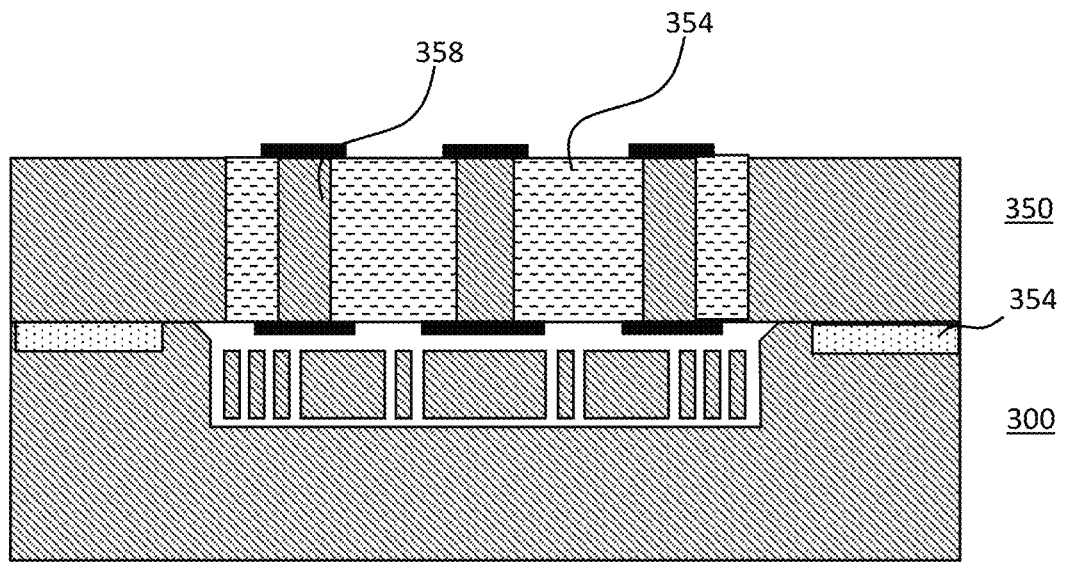
FIG. 6 illustrates two bonded microstructures according to an exemplary aspect.

FIG. 6 illustrates an example where the first and second microstructures 300, 350 are similar to the ones shown in FIG. 3, but the first glass region 354 and the second glass region 356 are in different microstructures. In this example, the first glass region 354 is in the first microstructure 300, and the alkali metal content of the first glass material of the first glass region 354 enables sealing the gap by anodically bonding the first glass region to the silicon material of the second microstructure 350. As in FIG. 3, the second glass regions 356 are arranged into positions that do not need to undergo the anodic bonding process and therefore their alkali metal content is different from the alkali metal content of the first glass material. Specifically, the second microstructure 350 is a cap microstructure that includes a plurality of through vias 358, electrically isolated from each other by regions of second glass material 356.

Figure 7:
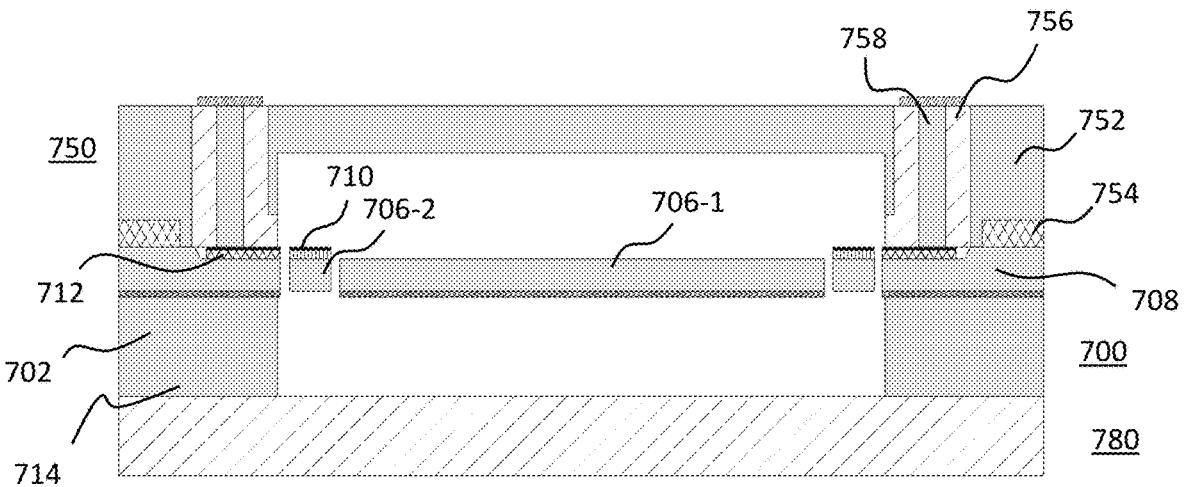
FIG. 7 illustrates three bonded microstructures according to an exemplary aspect.

FIG. 7 illustrates yet another example, where the different glass regions are in the same microstructure, but this time the microelectromechanical element includes piezoelectric transducers. In this example, the mobile structure parts include at least one suspender carrying a piezoelectric actuator and the piezoelectric actuator is connected to the internal electrode. Furthermore, in this example, the microelectromechanical element includes three microstructures that have been anodically bonded to each other. As may be seen in FIG. 7, the microelectromechanical element includes a first microstructure 700, a second microstructure 750 and a third microstructure 780. The first microstructure includes a body 702 and a recess 704 and mobile structure parts that are suspended to move within the recess. The mobile structure parts include a mirror element 706-1 and two or more suspenders 706-2 that suspend the mirror element from the body 702. More specifically, each suspender 702-2 is an elongate element, one end of which is fixed to the body 702, the other end of which is coupled to the mirror element 706-1. The suspender carries a piezoelectric actuator 710 which includes an electrode and layers of piezoelectrical material that elongate by different amounts when a bias voltage is applied via the electrode. The piezoelectric actuator bends the suspender and makes the mirror move in a way controlled by the bias voltage. The mirror may be actuated to a tilting motion with two suspenders, a rotatably scanning motion may be implemented with three or more suspenders. The first microstructure 700 also includes a terminal 712 through which the bias voltage can be fed to the piezoelectric actuator. A region 708 that is on one side of the first microstructure surrounds the recess 704, is formed of the wafer material and can be anodically bonded to glass. Correspondingly, a region 714 on the other side of the first microstructure provides a surface for anodic bonding with glass.

The second microstructure 750 is a cap element that includes regions of wafer material 752, regions of first glass material 754 and regions of second glass material 756. The regions of wafer material include at least one through via 758. As in the example of FIG. 3, the through via 758 is a continuous formation of the wafer material of the second wafer, and it extends in the out-of-plane direction from one side of the second microstructure to another side of the second microstructure, i.e. through the second microstructure. The through via 758 is surrounded by a second glass region 756 that electrically insulates the through via from other parts of the second microstructure. The through via 758 terminates to the terminal 712 on the first microstructure. On the second side the through via 78 terminates to an external electrode 362 that provides a point of electrical contact for the microelectromechanical element.

The third microstructure 780 is a glass wafer structure that provides an optical window for incoming and outgoing light beams of the mirror element 706-1. The glass wafer may be a uniform formation of the first glass material so that it can be anodically bonded to the region 714 on the first microstructure. On the other hand, the glass wafer may be mainly of the second glass material. The glass wafer may be masked with polysilicon and recesses for regions to be anodically bonded may be etched into it with a hydrofluoric acid (HF) solution. As the glass transition temperature of the second glass material is higher than the glass transition temperature of the first glass material, the recesses may then be filled with the first glass material so that only parts of the surface include glass with higher alkali metal content.

FIGS. 8a to 8i provide first a simplified illustration of an example method for manufacturing a microelectromechanical element of FIG. 3 according to an exemplary aspect. The method is illustrated by means of a single microstructure, but for a person skilled in the art it is clear that in either of the wafers, the process stages are performed to the plurality of microstructures to be later on diced off the wafer, as explained with FIG. 1.

Figure 8A:
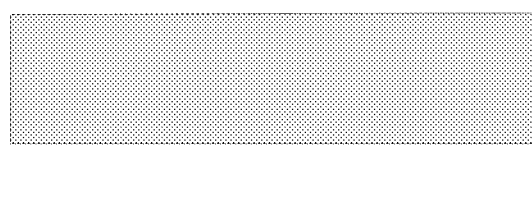
FIGS. 8a to 8i provide a simplified illustration of an example method for manufacturing a microelectromechanical element according to an exemplary aspect.

FIG. 8a shows a starting point of one of the microstructures, a part of a silicon wafer from which a cap of the microelectromechanical element is to be formed. In this example, the first glass region and the second glass region are formed into the same microstructure, specifically into the second microstructure, as shown in FIG. 3.

Figure 8B:
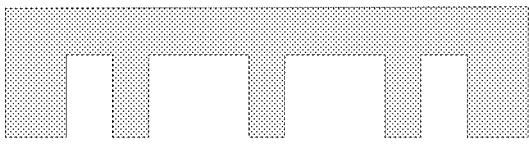

FIG. 8b shows patterning a first group of one or more recesses into the second microstructure. In this example, the regions of wafer material within the first group of recesses are pillar-like formations that protrude away from the bottom of the recesses. These pillar-like formations will serve in the microelectromechanical element as separate through vias that extend from one side of the cap to another side of the cap.

Figure 8C:
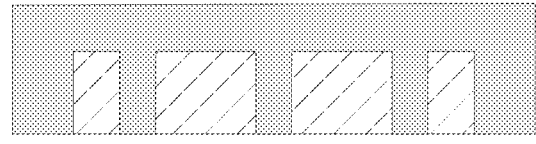

FIG. 8c shows forming second glass regions. This includes filling the first group of recesses with a second glass material. As explained above, the alkali metal content of the second glass material is substantially lower than that of the first glass material.

Figure 8D:
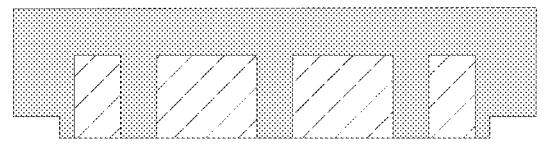

FIG. 8d shows patterning a second group of recesses. The second recesses are preferably structured to form a periphery that surrounds central parts of the microstructure. Preferably the periphery formed by the recess runs in the outer edge of the microstructure.

Figure 8E:
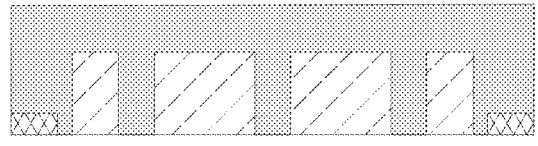

FIG. 8e shows forming first glass regions by filling the second group of recesses with a first glass material. As explained above, the alkali metal content of the first glass material is such that it enables anodic bonding of the first glass region to a silicon wafer material surface.

Figure 8F:
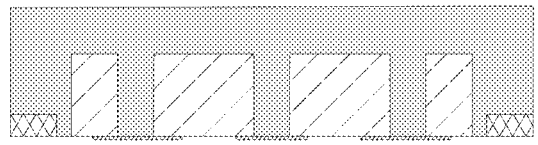

FIG. 8f shows deposition of a pattern of metal regions that are in contact with the pillar like formations. The metal regions will thus provide internal electric terminals for the through vias of the microelectromechanical element.

Figure 8G:
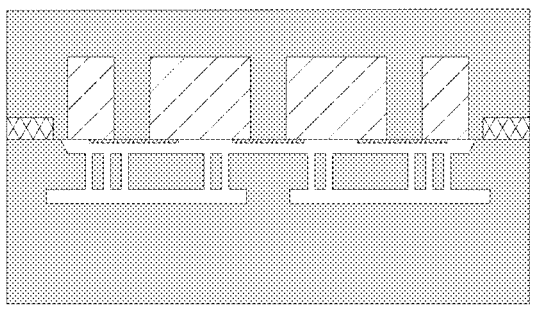

FIG. 8g illustrates bonding of the first wafer and the second wafer by showing the anodic bonding of the second microstructure to a first microstructure. The first microstructure has been formed by patterning into a first wafer for each first microstructure a recess and mobile structure parts suspended to move within the recess. Various methods for forming such mobile structural parts into a wafer are well known to a person skilled in the art.

Figure 8H:
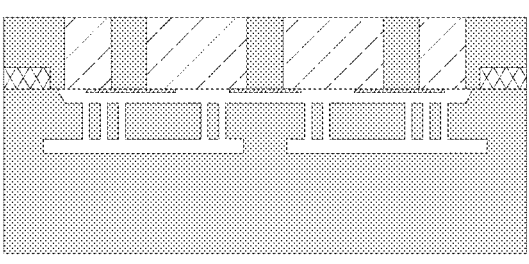

FIG. 8h shows thinning of the second wafer so that the pillar like formations and the second glass regions are exposed. The pillar like formations now transform into through vias that are surrounded with electrically isolating second glass regions and terminate into internal electrodes. The thinning is typically implemented by grinding the wafer surface to a defined level.

Figure 8I:
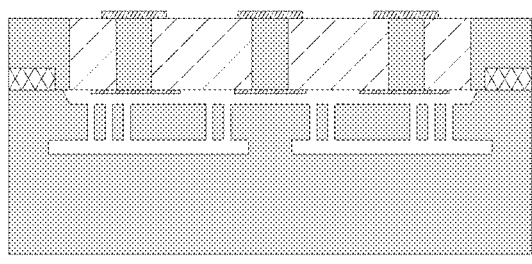

FIG. 8i shows deposition of a pattern of metal regions on other ends of the through vias to provide an external electrical terminal for them.

As discussed with FIG. 3, the second glass region is formed of a second glass material, wherein the alkali metal content of the second glass material is less than the alkali metal content of the first glass material, as explained earlier. The glass region with higher glass transition temperature (e.g., the second glass region) is formed before the glass region with a lower glass transition temperature (e.g. the first glass region).

FIGS. 9a to 9l provide a simplified illustration of an example method for manufacturing a microelectromechanical element of FIG. 4. Again, the method is illustrated by means of a single microstructure, but for a person skilled in the art it is clear that in either of the wafers, the process stages are performed to the plurality of microstructures to be later on diced off the wafer.

Figure 9A:
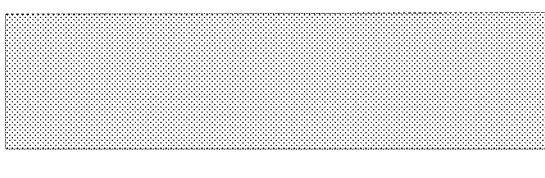
FIGS. 9a to 9l provide another simplified illustration of an example method for manufacturing a microelectromechanical element according to an exemplary aspect.

FIG. 9a shows a starting point of one of the microstructures, a part of a silicon wafer from which a cap of the microelectromechanical element is to be formed. In this example, the cap is formed of the second microstructure of FIG. 4.

Figure 9B:
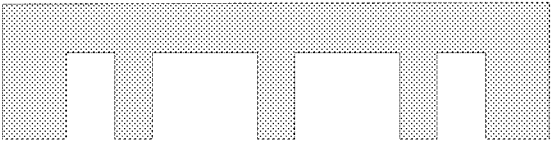

FIG. 9b shows patterning a first group of one or more recesses into the second microstructure. In this example, the regions of wafer material within the first group of recesses are pillar-like formations that protrude away from the bottom of the first group of recesses. These pillar-like formations will serve in the microelectromechanical element as separate through vias that extend from one side of the cap to another side of the cap.

Figure 9C:
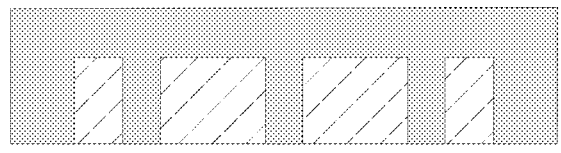

FIG. 9c shows forming into the cap second glass regions. This is done by filling the first group of recesses with a second glass material. As explained above, the alkali metal content of the second glass material is substantially lower than of the first glass material.

Figure 9D:
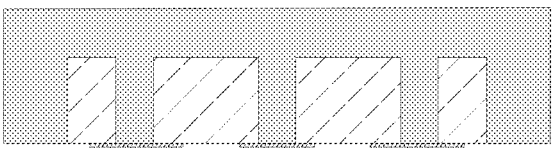

FIG. 9d shows deposition of a pattern of metal regions that are in contact with the pillar like formations and thus provide an internal electric terminal for them.

Figures 9E, 9F, 9G, 9H, 9I:
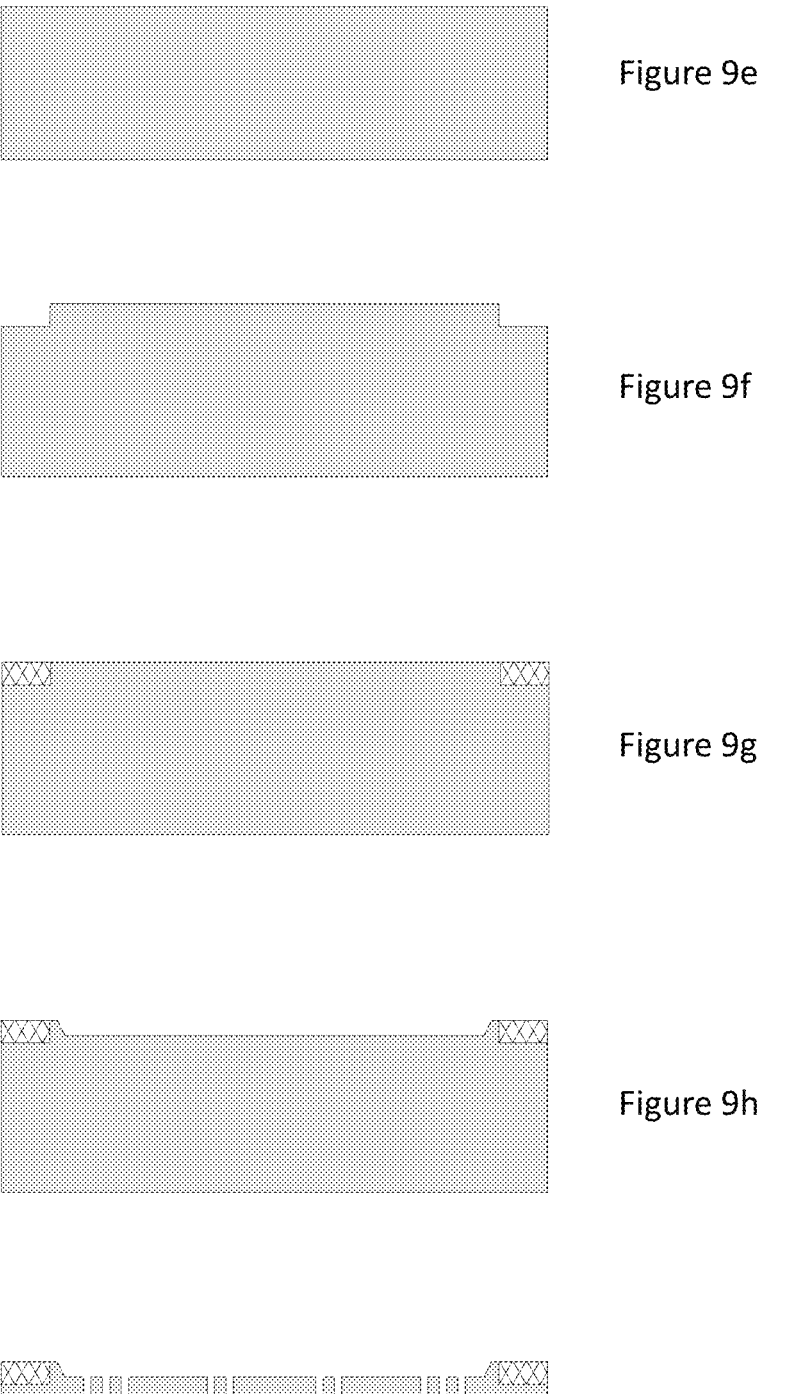
Figure 9J:
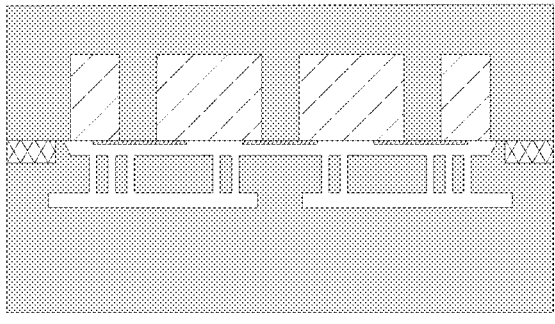
Figure 9K:
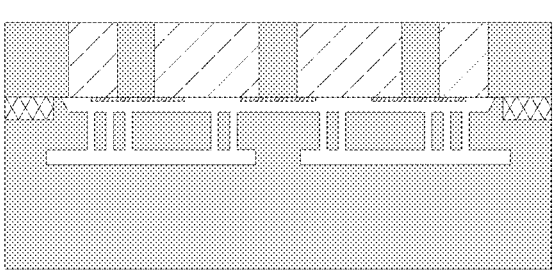
Figure 9L:
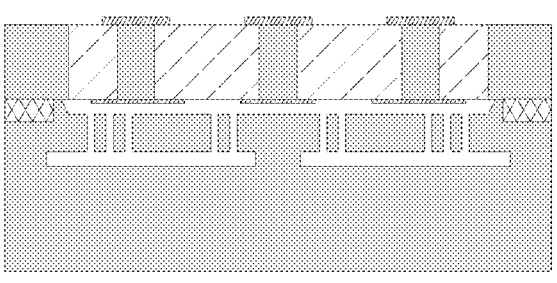

FIG. 9e shows a starting point of the other one of the microstructures, a part of a silicon wafer into which mobile structure parts of the microelectromechanical element are to be formed. In this example, this is the first wafer from which the first microstructures of FIG. 4 are made of.

FIG. 9_f_ shows patterning a second group of recesses, this time into the first microstructure. The second recesses are structured to form a periphery that surrounds central parts of the microstructure, preferably the periphery formed by the recess that runs in the outer edge of the microstructure.

FIG. 9_g_ shows forming first glass regions by filling the second group of recesses with a first glass material. As explained above, the alkali metal content of the first glass material is such that it enables anodic bonding of the first glass region to a silicon wafer material surface.

FIG. 9_h_ shows etching into the first microstructure a recess that enables motions of the mobile structure parts.

FIG. 9_i_ shows etching of the first microstructure to release mobile structure parts so that they remain fixed to the body of the first microstructure but can flexibly move in relation to it.

FIG. 9_j_ shows anodic bonding of the first microstructure and the second microstructure. In this example, the first glass region in the first microstructure is anodically bonded to the silicon wafer material of the second microstructure.

FIG. 9_k_ shows thinning of the second wafer so that the pillar like formations and the second glass regions are exposed. The pillar like formations thus transform into through vias that are surrounded with electrically isolating second glass regions. The thinning is typically implemented by grinding the wafer surface to a defined level.

FIG. 9_l_ shows deposition of a pattern of metal regions on other ends of the through vias and thus provide an external electrical terminal for them.

As discussed with FIG. 4, the second glass region is formed of a second glass material, wherein the alkali metal content of the second glass material is less than the alkali metal content of the first glass material, as described earlier.

Regarding the examples described with FIGS. 8_a-l_ and 9_a-l_, as discussed with FIG. 5, the first microstructures can be formed from a cavity wafer that includes an insulator layer between two layers of wafer material, and one of the two layers of wafer material includes pre-etched cavities. The mobile structure parts and the gap can be patterned to the other one of the two layers of wafer material.

In general, it is noted that the exemplary embodiments described above are intended to facilitate the understanding of the present invention, and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above, and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A microelectromechanical element comprising:
   a plurality of microstructures of wafers bonded to each other, such that a gap is closed by bonding of the microstructures;
   mobile structure parts suspended to move within the closed gap;
   at least one internal electrode arranged in the gap and configured to detect or actuate movement of the mobile structure parts; and
   patterned regions of silicon wafer material and glass material, the regions of glass material including at least a first glass region comprising a first glass material and a second glass region comprising a second glass material,
   wherein at least one microstructure in the plurality of microstructures includes a plurality of silicon through vias, electrically isolated from each other by regions of second glass material,
   wherein the first glass material enables anodic bonding with the silicon wafer material, and
   wherein the second glass material has an alkali metal content that is less than an alkali metal content of the first glass material.

2. The microelectromechanical element according to claim 1,
   wherein the first glass region and the second glass region are in one of the plurality of microstructures, and
   wherein a glass transition temperature of the first glass region is lower than a glass transition temperature of the second glass region.

3. The microelectromechanical element according to claim 1, wherein the first glass region and the second glass region are in different microstructures.

4. The microelectromechanical element according to claim 1, wherein:
   the plurality of microstructures include a first microstructure and a second microstructure,
   the mobile structure parts are in the first microstructure,
   the gap is closed by bonding the first microstructure to the second microstructure, and
   the second glass region is in the second microstructure.

5. The microelectromechanical element according to claim 4, wherein the at least one internal electrode is on a first side of the second microstructure.

6. The microelectromechanical element according to claim 5, wherein:
   the second microstructure includes at least one external electrode on a second side of the second microstructure,
   a through via formed of the silicon wafer material connects the at least one internal electrode to the at least one external electrode, and
   the second glass region surrounds the through via.

7. The microelectromechanical element according to claim 6, wherein the second microstructure is a cap microstructure that includes the plurality of through vias that are electrically isolated from each other by regions of second glass material.

8. The microelectromechanical element according to claim 1, wherein the alkali metal content of the first glass material in form of oxides is 1 wt % or more.

9. The microelectromechanical element according to claim 1, wherein the alkali metal content of the second glass material in form of oxides is less than 0.5 wt %.

* * * * *